(12) United States Patent
Lee

(10) Patent No.: US 8,130,491 B2
(45) Date of Patent: Mar. 6, 2012

(54) COMPUTER EQUIPPED WITH A FAN RACK TO FACILITATE ASSEMBLY AND DISASSEMBLY OF HARD DISKS

(75) Inventor: Andrew Lee, Fremont, CA (US)

(73) Assignee: Antec, Inc., Fremont, CA (US)

( * ) Notice: Subject to any disclaimer, the term of this patent is extended or adjusted under 35 U.S.C. 154(b) by 195 days.

(21) Appl. No.: 12/716,762

(22) Filed: Mar. 3, 2010

(65) Prior Publication Data

US 2011/0216498 A1 Sep. 8, 2011

(51) Int. Cl.
*G06F 1/16* (2006.01)
(52) U.S. Cl. ................. 361/679.33; 312/237; 360/265.1; 248/680
(58) Field of Classification Search ............... 435/287.1, 435/286.1; 361/679.21, 679.39, 679.33, 361/679.31, 679.08, 679.02, 679.09, 679.35, 361/679.34; 312/223.1, 223.2, 237, 219, 312/213, 7.2; 360/97.02, 245.8, 314, 224, 360/265.1, 75, 99.12, 97.01, 98.04; 206/308.1, 206/320, 307, 454; 248/60, 631, 636, 308.3, 544, 680; 454/184, 187, 251, 252

See application file for complete search history.

(56) References Cited

U.S. PATENT DOCUMENTS

| | | | |
|---|---|---|---|
| 6,522,537 B2* | 2/2003 | Chen | 361/679.39 |
| 2008/0130217 A1* | 6/2008 | Chen | 361/685 |

* cited by examiner

*Primary Examiner* — Hung Duong
(74) *Attorney, Agent, or Firm* — Muncy, Geissler, Olds & Lowe, PLLC

(57) ABSTRACT

A computer equipped with a fan rack aims to facilitate disassembly and assembly of hard disks. The computer includes a casing, a panel located at the front side of the casing and a plurality of side panels on various sides of the casing. The casing has a hard disk installation section. The panel has a hard disk replacing opening corresponding to the hard disk installation section. The panel hinges at least one fan rack corresponding to the hard disk installation section. The fan rack holds at least one fan. The fan provides cooling airflow to the hard disk installed on the hard disk installation section. The fan rack can be opened or closed by pivoting so that the hard disk can be plugged, unplugged or displaced without relying on any tools.

12 Claims, 7 Drawing Sheets

COMPUTER EQUIPPED WITH A FAN RACK TO FACILITATE ASSEMBLY AND DISASSEMBLY OF HARD DISKS

FIELD OF THE INVENTION

The present invention relates to a computer equipped with a fan rack and particularly to a computer equipped with a pivoted fan rack to facilitate plugging, unplugging and replacement of hard disks.

BACKGROUND OF THE INVENTION

With constant advancement of technology, computers have become indispensable for many people in work, learning, recreation or other activities.

Many personal computer users nowadays often prepare a number of hard disks to store or back up data. Installation of a hard disk generally has to disassemble side panels of the computer first; next, allocate an installation space in the interior of the computer for the hard disk; then fasten the hard disk by fastening screws individually in preformed screw holes. In the event that the hard disk malfunctions and has to be disassembled for repair, or replacement of the hard disk is required, the side panels of the computer have to be disassembled first, then perform the procedures mentioned above in reverse, and unfasten the screws to disassemble the hard disk for replacement. Hence the conventional approach of installation or replacement of the hard disk in the computer involves tedious procedures. Due to the interior space of the computer is limited and has to install many other electronic elements, user's visual sight often is blocked. As a result, assembling and disassembling tasks are quite difficult and troublesome. The probability of damaging other electronic elements is high and a lot of manpower is needed. All these make usability lower. Hence the conventional tedious approach of assembling and disassembling the hard disk of the computer not only hinders information exchange and causes additional waste of user's precious time, also cannot fully meet the requirement of processing or exchanging a great number of digital data in fast speed.

SUMMARY OF THE INVENTION

The primary object of the present invention is to solve the aforesaid disadvantages and enable users to easily disassemble and replace hard disks without the aid of tools.

To achieve the foregoing object, the present invention provides a computer equipped with a fan rack to facilitate assembly and disassembly of hard disks. The computer includes a casing, a panel located at a front side of the casing and a plurality of side panels on various sides of the casing. The casing has a hard disk installation section. The panel has a hard disk replacing opening corresponding to the hard disk installation section, and also has a pivot portion to pivotally couple with at least one fan rack. The fan rack holds at least one fan. The fan provides cooling airflow to a hard disk installed on the hard disk installation section. The fan rack can be opened or closed by pivoting about the pivot portion so that the hard disk can be plugged, unplugged or displaced.

Compared with the conventional technique, the present invention can save a lot of time for hard disk disassembly and assembly.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
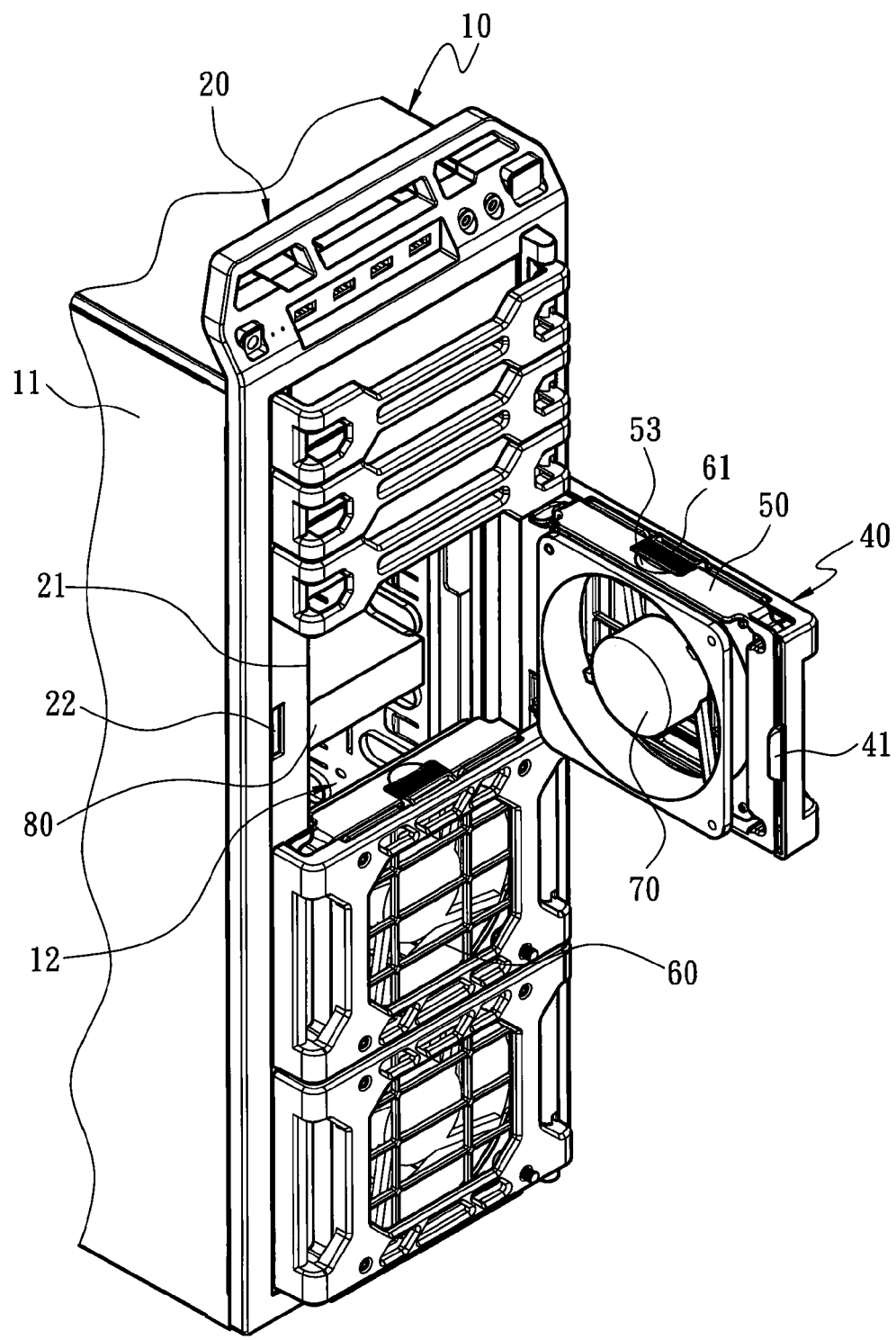
FIG. 1 is a perspective view of the invention.
Figure 2:
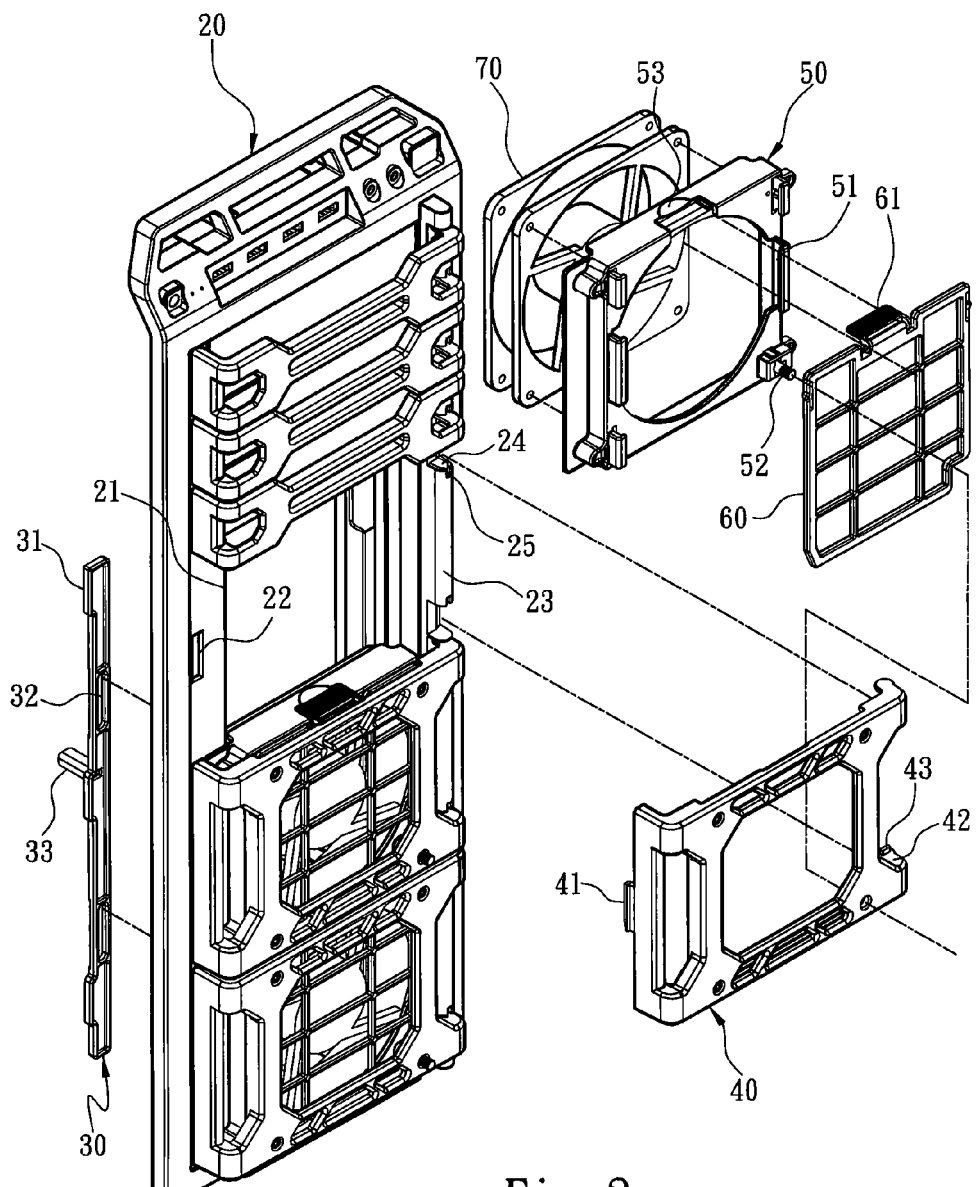
FIG. 2 is an exploded view of the invention.
Figure 3:
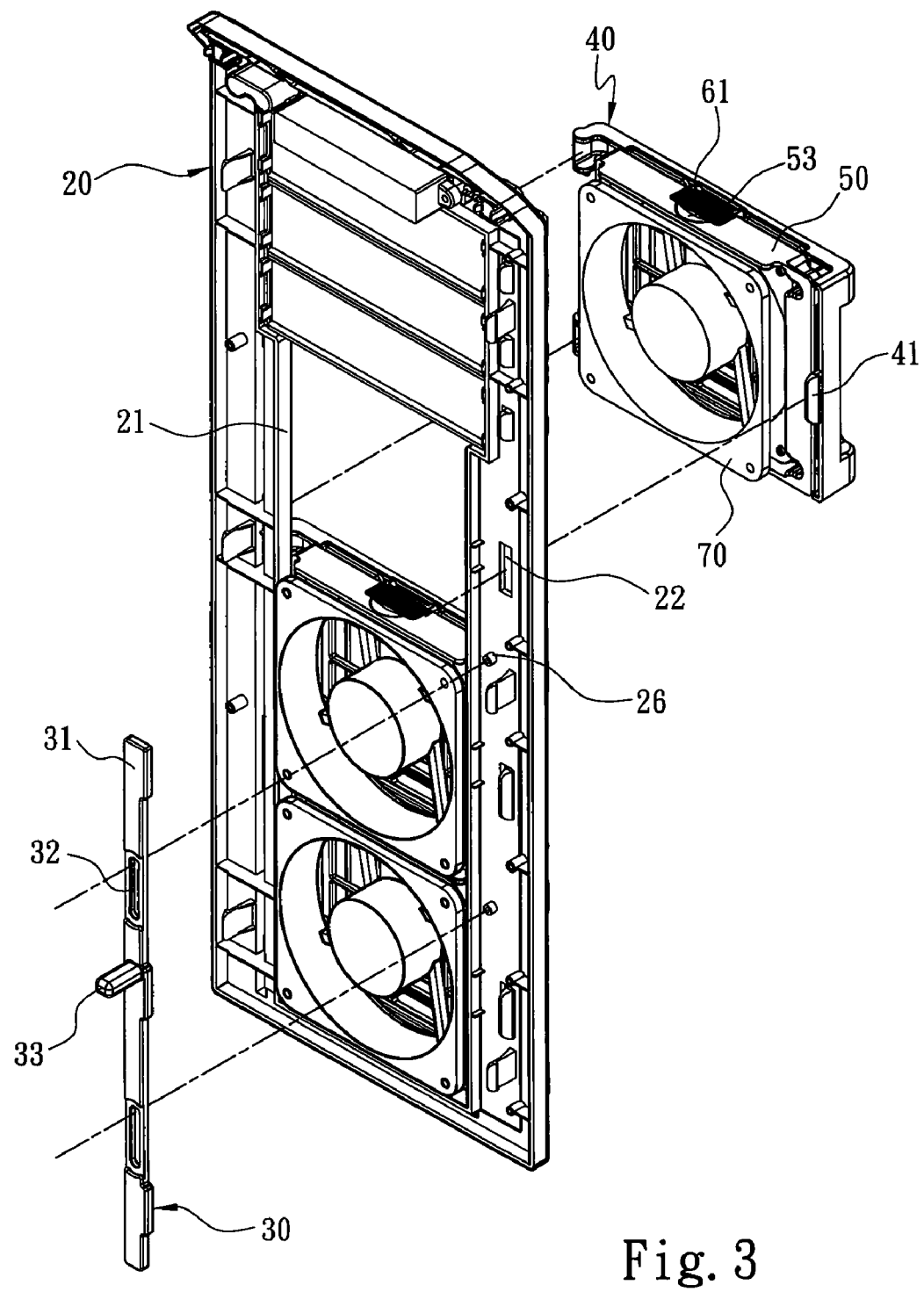
FIG. 3 is another exploded view of the invention.
Figure 4A:
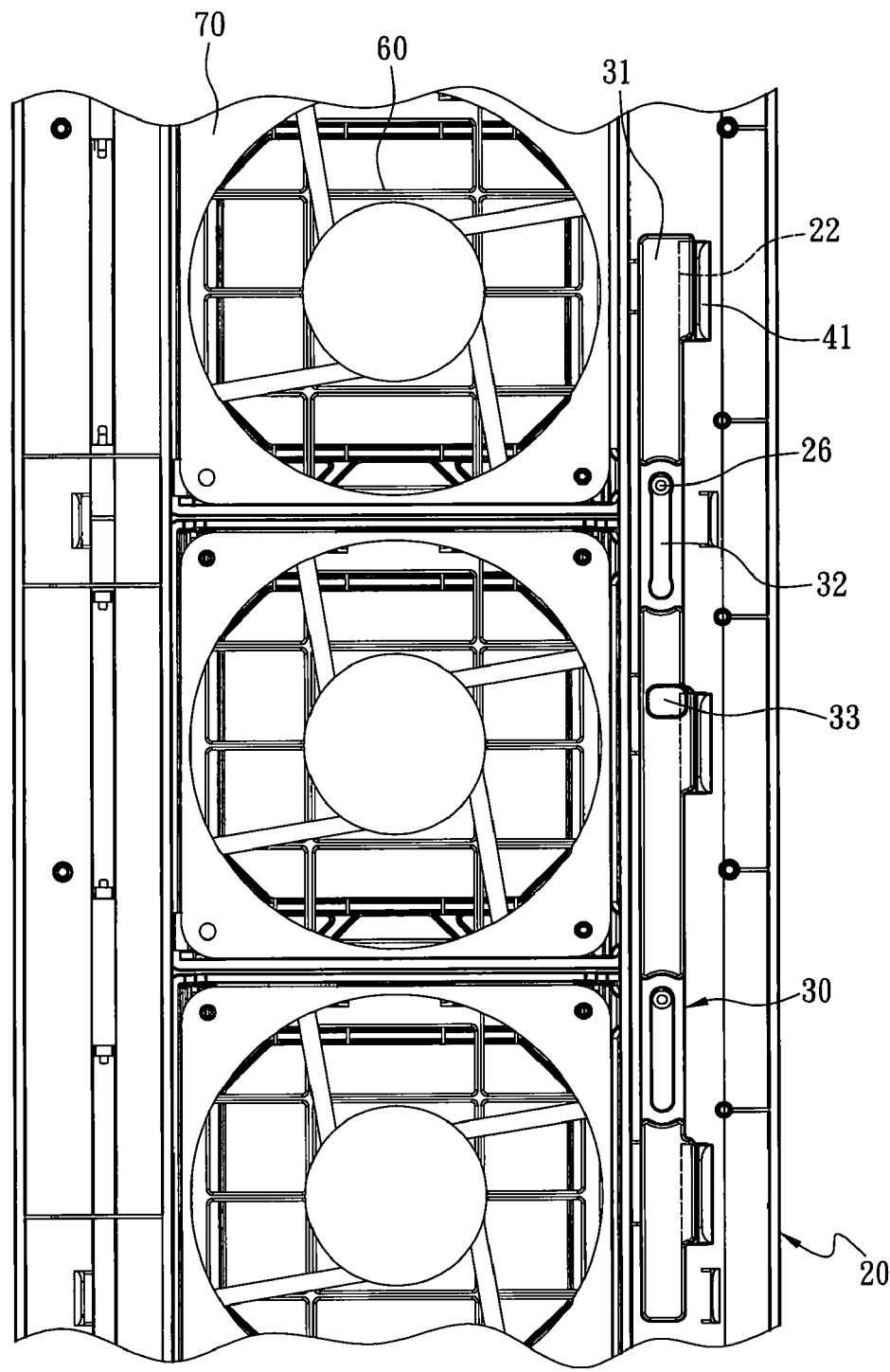
FIGS. 4A and 4B are schematic views of the invention in a use condition.
Figure 4B:
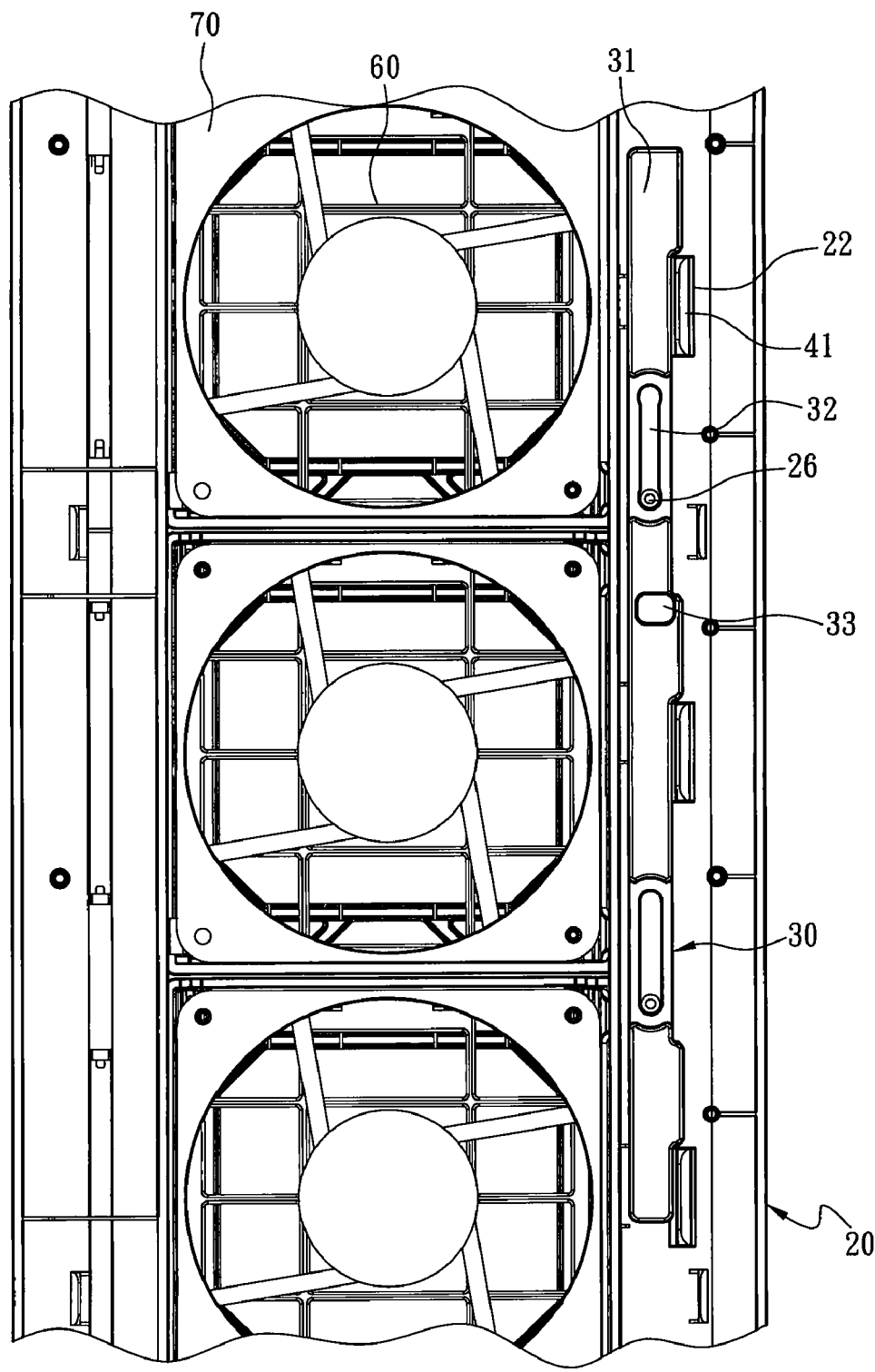
Figure 5A:
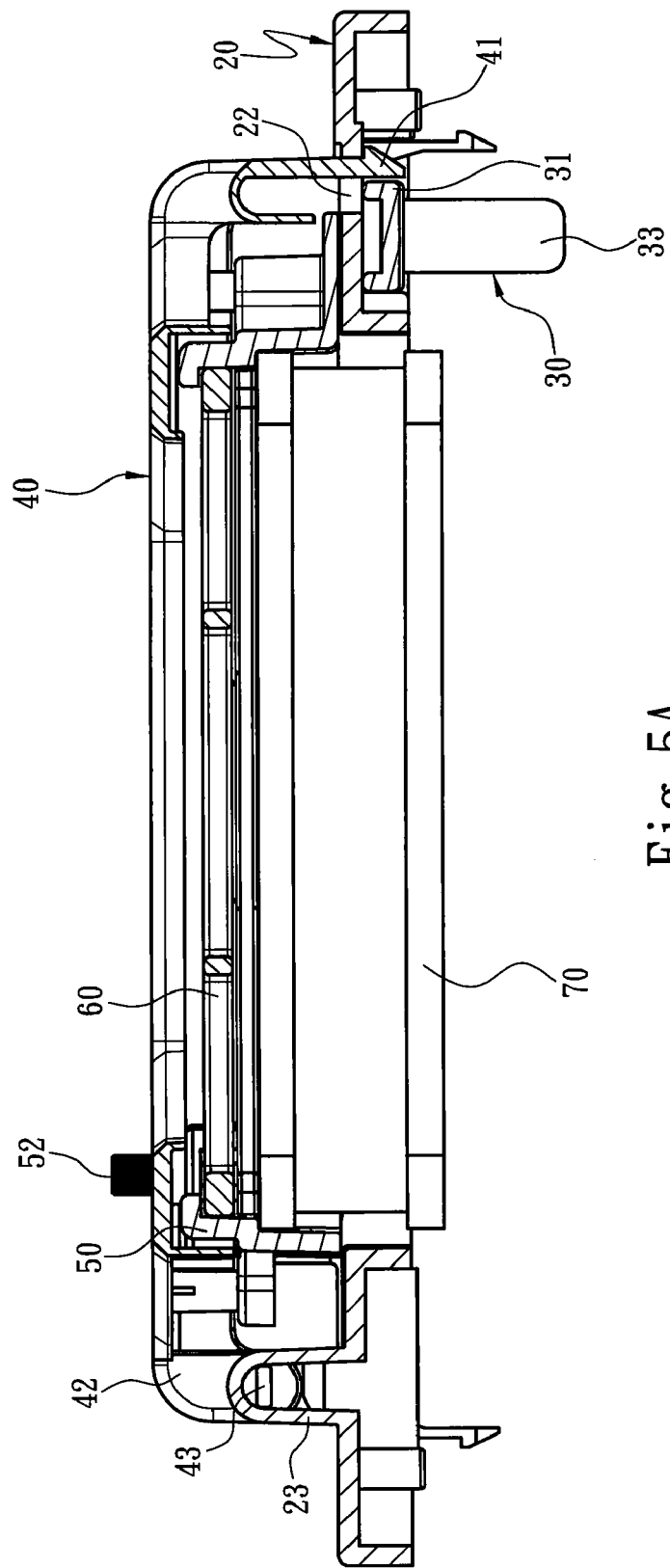
FIGS. 5A and 5B are schematic views of the invention in another use condition.
Figure 5B:
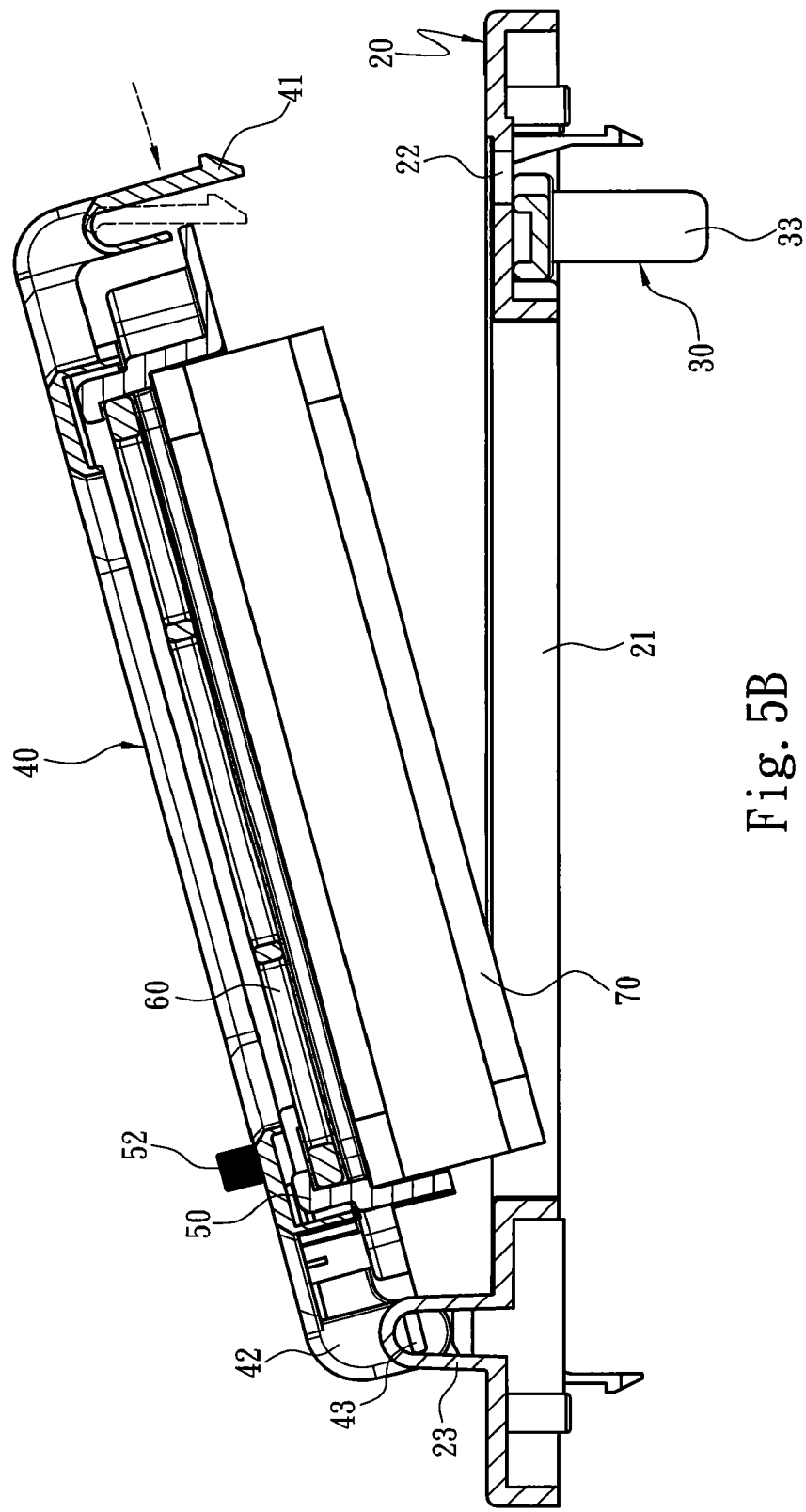

Please refer to FIGS. 1, 2 and 3, the present invention aims to provide a computer equipped with a fan rack to facilitate disassembly and assembly of hard disks. It mainly includes a computer and at least one fan rack 40. The computer comprises a casing 10, a panel 20 located at a front side of the casing 10 and a plurality of side panels 11 located on various sides of the casing 10. The casing 10 has a hard disk installation section 12. The panel 20 has a hard disk replacing opening 21 corresponding to the hard disk installation section 12. The fan rack 40 holds at least one fan 70. The fan rack 40 is hinged on the panel 20 corresponding to the hard disk installation section 12 through pivot portions 23 and 42. Thus forms the main structure of the invention. The fan 70 on the fan rack 40 provides cooling airflow to a hard disk 80 installed on the hard disk installation section 12. The fan rack 40 and the fan 70 can be pivoted together to allow the hard disk 80 to be plugged, unplugged and displaced without the aid of tools.

The pivot portion 42 located on the fan rack 40 has a pivot strut 43, and the other pivot portion 23 located on the panel 20 has a pivot hole 24 and a notch 25 communicating with the pivot hole 24. The pivot strut 43 can pass through the notch 25 and be held in the pivot hole 24 to allow the fan rack 40 to pivot against the panel 20. The fan rack 40 and the panel 20 have respectively a first anchor portion 41 and a second anchor portion 22 for positioning during pivoting. In an embodiment of the invention, the first anchor portion 41 is a latch hook while the second anchor portion 22 is a latch slot. Moreover, the fan rack 40 and the fan 70 are interposed by a holding rack 50 and a fan mesh 60 held on the holding rack 50. The holding rack 50 has a holding slot 51 to receive the fan mesh 60. The fan mesh 60 has a hinged drawing portion 61. The holding rack 50 has a notch 53 corresponding to the drawing portion 61. Through the notch 53, the drawing portion 61 can be drawn to disassemble the fan mesh 60. The holding rack 50 further has a switch 52 running through the fan rack 40 to activate the fan 70 and control rotation speed thereof.

The panel 20 also has a latch member 30 which has a latch portion 31 to latch or open the fan rack 40. The latch member 30 and the panel 20 have respectively a slot 32 and a guiding member 26 corresponding to the slot 32. The latch member 30 has a force applying portion 33 which is movable to move the latch member 30 through the slot 32 and guiding member 26 to generate a movement displacement. Referring to FIGS. 4A through 5B, the latch member 30 has a first position and a second position in the movement displacement. At the first position, the guiding member 26 is positioned at an upper end of the slot 32, and the latch portion 31 and the first anchor portion 41 of the fan rack 40 are latched together. The first anchor portion 41 is confined and not movable, and maintains an anchor relationship with the second anchor portion 22 in a latched condition (referring to FIGS. 4A and 5A). After the latch portion 30 is subject to a force, the guiding member 26 escapes from the upper end of the slot 32 and moves to the lower end, and the latch member 30 is moved to the second position, and the latch portion 31 is separated from the first anchor portion 41 of the fan rack 40, meanwhile the first anchor portion 41 escapes from the second anchor portion 22 under the force to release the anchor relationship and enter an open condition (referring to FIGS. 4B and 5B), then pivot displacement can take place. By means of the latch member 30, the hard disk 80 can be fastened in the computer without relying fastening elements such as screws. When plugging, unplugging or displacement of the hard disk 80 is desired, merely remove the side panels 11 of the computer and adjust the latch member 30 in the open condition, the fan rack 40 can be opened to plug, unplug or displace the hard disk 80 without using any tool.

As a conclusion, the present invention mainly includes an opening on the panel 20 of a computer to hold a hard disk 80. The panel 20 has at least one fan rack 40 corresponding to the hard disk 80. The fan rack 40 holds a fan 70. The fan 70 is driven by the fan rack 40 to generate a pivot displacement like a door. When closed, the fan 70 can provide cooling airflow for the hard disk 80. The fan rack 40 can be opened to draw or insert the hard disk 80. Installation or replacement of the hard disk 80 does not need to disassemble the computer with tools. Thus usability improves.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A computer equipped with a fan rack to facilitate disassembly and assembly of hard disks, comprising:
   a computer including a casing, a panel located at a front side of the casing and a plurality of side panels on various sides of the casing, the casing including a hard disk installation section, the panel including a hard disk replacing opening corresponding to the hard disk installation section; and
   at least one fan rack which holds at least one fan and includes a pivot portion corresponding to the hard disk installation section to be hinged on the panel, the fan providing cooling airflow to the hard disk installed on the hard disk installation section, the fan rack pivoting about the pivot portion for opening or closing to allow the hard disk to be plugged, unplugged or displaced.

2. The computer equipped with the fan rack of claim 1, wherein the fan rack and the panel include respectively a first anchor portion and a second anchor portion to form anchor relationship during pivoting.

3. The computer equipped with the fan rack of claim 2, wherein the first anchor portion and the second anchor portion are respectively a latch hook and a latch slot.

4. The computer equipped with the fan rack of claim 2, wherein the panel includes a latch member which includes a latch portion to latch or open the fan rack.

5. The computer equipped with the fan rack of claim 4, wherein the latch member forms a movement displacement which includes a first position in which the latch portion is latched on the first anchor portion and a second position in which the latch portion is separated from the first anchor portion.

6. The computer equipped with the fan rack of claim 5, wherein the latch member and the panel include respectively a slot and a guiding member corresponding to the slot to form the movement displacement.

7. The computer equipped with the fan rack of claim 4, wherein the latch member includes a force applying portion to make the latch member to generate the movement displacement.

8. The computer equipped with the fan rack of claim 1, wherein the fan rack and the fan are interposed by a holding rack and a fan mesh held on the holding rack.

9. The computer equipped with the fan rack of claim 8, wherein the holding rack includes a holding slot to receive the fan mesh.

10. The computer equipped with the fan rack of claim 8, wherein the fan mesh includes a drawing portion hinged thereon and the holding rack includes a notch corresponding to the drawing portion.

11. The computer equipped with the fan rack of claim 8, wherein the holding rack includes a switch running through the fan rack.

12. The computer equipped with the fan rack of claim 1, wherein the fan rack and the panel include respectively a mating pivot portion, the pivot portion of the fan rack including a pivot strut, the other pivot portion of the panel including a pivot hole corresponding to the pivot strut and a notch to allow the pivot strut to be coupled with the pivot hole.

* * * * *